(12) United States Patent
Erlich et al.

(10) Patent No.: US 9,546,508 B2
(45) Date of Patent: Jan. 17, 2017

(54) MEMS HINGES WITH ENHANCED ROTATABILITY

(71) Applicants: Raviv Erlich, Rehovot (IL); Yuval Gerson, Tel-Mond (IL)

(72) Inventors: Raviv Erlich, Rehovot (IL); Yuval Gerson, Tel-Mond (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/825,213

(22) Filed: Aug. 13, 2015

(65) Prior Publication Data

US 2015/0345196 A1 Dec. 3, 2015

Related U.S. Application Data

(63) Continuation of application No. 14/207,796, filed on Mar. 13, 2014, now Pat. No. 9,140,042.
(Continued)

(51) Int. Cl.
*E05D 7/00* (2006.01)
*E05D 11/00* (2006.01)
(Continued)

(52) U.S. Cl.
CPC ............... *E05D 7/00* (2013.01); *B81B 3/0043* (2013.01); *B81C 1/00198* (2013.01);
(Continued)

(58) Field of Classification Search
CPC .... B81C 1/00523; B81C 1/00198; B81C 5/00; B81C 3/0043; G02B 26/10; G02B 26/0833; E05D 1/02; E05D 7/00; E05D 11/0081; G11B 5/5552; Y10T 16/522; Y10T 16/525; Y10T 16/555; Y10T 16/5389; Y10T 29/24
(Continued)

(56) References Cited

U.S. PATENT DOCUMENTS 6,245,444 B1 * 6/2001 Marcus .............. G01R 1/06733
267/156
6,543,087 B2 * 4/2003 Yeh ........................ B81B 3/0062
16/292

(Continued)

FOREIGN PATENT DOCUMENTS

JP          200699045 A    10/2007
WO       2010128864 A1    11/2010
WO       2012080158 A1     6/2012

OTHER PUBLICATIONS

European Application # 14762298.9 Search Report dated Oct. 4, 2016.
JP Application # 2015-562500 Office Action dated Oct. 17, 2016.

*Primary Examiner* — William Miller
(74) *Attorney, Agent, or Firm* — D. Kligler IP Services Ltd.

(57) ABSTRACT

A mechanical device includes a long, narrow element made of a rigid, elastic material. A rigid frame is configured to anchor at least one end of the element, which is attached to the frame, and to define a gap running longitudinally along the element between the beam and the frame, so that the element is free to move within the gap. A solid filler material, different from the rigid, elastic material, fills at least a part of the gap between the element and the frame so as to permit a first mode of movement of the element within the gap while inhibiting a different, second mode of movement.

20 Claims, 9 Drawing Sheets

Related U.S. Application Data

(60) Provisional application No. 61/781,086, filed on Mar. 14, 2013.

(51) Int. Cl.
  *B81B 3/00* (2006.01)
  *B81C 1/00* (2006.01)
  *E05D 1/02* (2006.01)
  *G02B 26/08* (2006.01)

(52) U.S. Cl.
  CPC ............ *B81C 1/00523* (2013.01); *E05D 1/02* (2013.01); *E05D 11/0081* (2013.01); *G02B 26/0833* (2013.01); *Y10T 16/522* (2015.01); *Y10T 16/525* (2015.01); *Y10T 29/24* (2015.01); *Y10T 29/25* (2015.01)

(58) Field of Classification Search
  USPC ....... 16/223, 225, 385, 308; 29/11; 438/694; 267/166, 167, 154, 155, 157; 310/12.03; 359/196.1
  See application file for complete search history.

(56) References Cited

U.S. PATENT DOCUMENTS

| | | | |
|---|---|---|---|
| 7,753,581 B2 * | 7/2010 | Hessler | C03C 15/00 267/166 |
| 7,952,781 B2 * | 5/2011 | Weiss | H04N 3/08 359/201.1 |
| 8,459,110 B2 * | 6/2013 | Cazzaniga | G01C 19/5747 73/504.12 |
| 2003/0227114 A1 * | 12/2003 | Jeong | B81B 3/007 267/154 |
| 2005/0002085 A1 | 1/2005 | Matshi | |
| 2007/0014512 A1 * | 1/2007 | Turner | G02B 26/0833 385/18 |
| 2008/0151345 A1 | 6/2008 | Zhou | |
| 2009/0008669 A1 * | 1/2009 | Maeda | G02B 26/0841 257/98 |
| 2009/0153941 A1 * | 6/2009 | Oden | G02B 26/0866 359/292 |
| 2010/0046062 A1 * | 2/2010 | Maeda | G02B 26/0833 359/291 |
| 2011/0298705 A1 | 12/2011 | Vaganov | |
| 2012/0120470 A1 * | 5/2012 | Kitazawa | H02N 1/006 359/200.1 |
| 2012/0236379 A1 * | 9/2012 | da Silva | G01S 7/4817 359/200.8 |
| 2013/0207970 A1 * | 8/2013 | Shpunt | G06T 15/00 345/419 |
| 2014/0132187 A1 * | 5/2014 | Mori | G02B 7/1821 318/128 |
| 2015/0241691 A1 * | 8/2015 | Asada | H02K 33/02 359/199.3 |

* cited by examiner

MEMS HINGES WITH ENHANCED ROTATABILITY

CROSS-REFERENCE TO RELATED APPLICATION

This application is a continuation of U.S. patent application Ser. No. 14/207,796, filed Mar. 13, 2014, which claims the benefit of U.S. Provisional Patent Application 61/781,086, filed Mar. 14, 2013, which is incorporated herein by reference.

FIELD OF THE INVENTION

The present invention relates generally to controlling the properties of elastic structures, such as elastic hinges in microelectromechanical systems (MEMS).

BACKGROUND

In microelectromechanical systems (MEMS), rotating hinges may be produced by etching a silicon substrate to form long, narrow beams. In the context of MEMS, as well as in the present description and in the claims, a "long, narrow" element has transverse dimensions (i.e., dimensions measured transversely to the longitudinal axis of the element) that are less than one tenth of the length of the beam. Such hinges are used, inter alia, in scanning micromirrors, such as those described, for example, in U.S. Pat. No. 7,952,781, whose disclosure is incorporated herein by reference. This patent describes a method of scanning a light beam and a method of manufacturing, which can be incorporated in a scanning device.

As another example, U.S. Patent Application Publication 2012/0236379 describes a LADAR system that uses MEMS scanning. A scanning mirror includes a substrate that is patterned to include a mirror area, a frame around the mirror area, and a base around the frame. A set of actuators operate to rotate the mirror area about a first axis relative to the frame, and a second set of actuators rotate the frame about a second axis relative to the base.

As yet another example, U.S. Patent Application Publication 2013/0207970, whose disclosure is incorporated herein by reference, describes a micromirror that is produced by suitably etching a semiconductor substrate to separate the micromirror from a support, and to separate the support from the remaining substrate. After etching, the micromirror (to which a suitable reflective coating is applied) is able to rotate in the Y-direction relative to the support on spindles, while the support rotates in the X-direction relative to the substrate on further spindles. (Such a support is also referred to as a gimbal, and the spindles are a type of hinges.) The micromirror and support are mounted on a pair of rotors, which are suspended in respective air gaps of magnetic cores. An electrical current driven through coils wound on the cores generates a magnetic field in the air gaps, which interacts with the magnetization of the rotors so as to cause the rotors to rotate or otherwise move within the air gaps.

As an alternative to the sorts of etched silicon hinges described above, Fujita et al. describe hinges made from polymeric material, in "Dual-Axis MEMS Mirror for Large Deflection-Angle Using SU-8 Soft Torsion Beam," *Sensors and Actuators* A 121 (2005), pages 16-21. This article describes a MEMS galvano-mirror with a double gimbal structure having soft torsion beams made of the photosensitive epoxy resin SU-8. This approach is said to give large deflection angles (over ±40°) for small driving power.

SUMMARY

Embodiments of the present invention that are described hereinbelow provide elastic micro-devices and methods for production of such devices.

There is therefore provided, in accordance with an embodiment of the present invention, a mechanical device, which includes a long, narrow element made of a rigid, elastic material, and a rigid frame configured to anchor at least one end of the element, which is attached to the frame, and to define a gap running longitudinally along the element between the beam and the frame, so that the element is free to move within the gap. A solid filler material, different from the rigid, elastic material, fills at least a part of the gap between the element and the frame so as to permit a first mode of movement of the element within the gap while inhibiting a different, second mode of movement.

In some embodiments, the long, narrow element includes a beam, which is configured as a hinge so as to rotate about a longitudinal axis of the beam relative to the frame, while the filler material inhibits transverse deformation of the beam. In one embodiment, the beam includes an anchor, broader than the hinge, which connects the hinge to the frame. Additionally or alternatively, the device includes a mirror, wherein a first end of the beam is attached to the frame, while a second end of the beam is attached to the mirror, so that the mirror rotates on the hinge relative to the frame.

In another embodiment, the device includes a sensor, which is configured to sense a relative rotation between the frame and the hinge. The sensor may be configured to sense an acceleration of the device responsively to the relative rotation. Alternatively, the device includes an energy-harvesting assembly, coupled to harvest energy generated by a relative rotation between the frame and the hinge.

In another embodiment, the long, narrow element is configured as a spiral spring.

Typically, the frame and the long, narrow element include parts of a semiconductor wafer, in which the gap is etched between the frame and the long, narrow element.

In some embodiments, the filler material has a Poisson ratio at least 50% higher than that of the long, narrow element, and a Young's modulus at least 50% less than that of the long, narrow element. Typically, the filler material is selected from a group of materials consisting of polymers and adhesives.

In an alternative embodiment, the filler material includes an array of nano-tubes.

There is also provided, in accordance with an embodiment of the present invention, a method for producing a mechanical device. The method includes forming, from a rigid, elastic material, a long, narrow element having at least one end attached to a rigid frame with a gap running longitudinally along the element between the beam and the frame, so that the element is free to move within the gap. At least a part the gap is filled with a solid filler material, different from the rigid, elastic material, so as to permit a first mode of movement of the element within the gap while inhibiting a different, second mode of movement.

In disclosed embodiments, the rigid, elastic material includes a semiconductor wafer, and forming the long, narrow element includes etching the semiconductor wafer to define both the frame and the long, narrow element, with the gap therebetween. In one embodiment, filling at least a part of the gap includes, after etching the gap, coating the wafer with the filler material, so that filler material fills the gap, and then removing an excess of the filler material outside the gap.

The present invention will be more fully understood from the following detailed description of the embodiments thereof, taken together with the drawings in which:

DETAILED DESCRIPTION OF EMBODIMENTS

Overview

Figure 1:
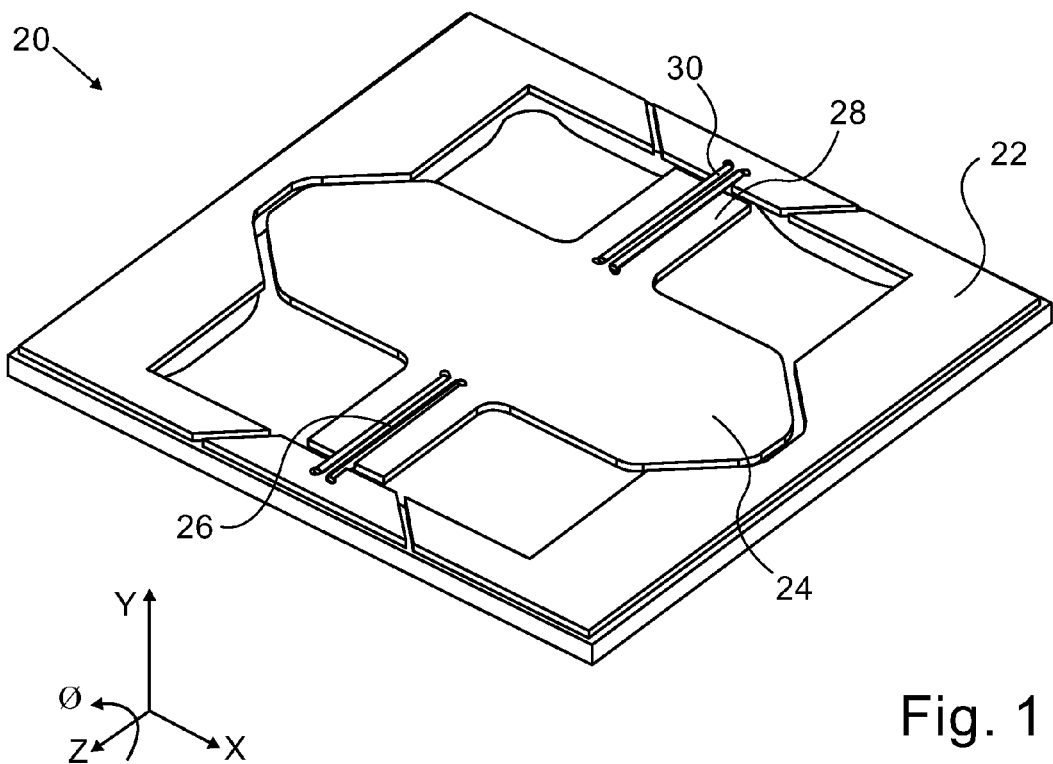
FIG. 1 is a schematic, pictorial illustration of a MEMS scanning mirror assembly, in accordance with an embodiment of the present invention.

Because of its high elasticity (Young's modulus E 150 GPa), crystalline silicon can be used in MEMS devices to produce excellent hinges and other sorts of springs. Such hinges are well suited, for example, to support scanning mirrors, as described above. The torsional properties of the silicon hinge determine the range of motion and the resonant frequency of rotation of the mirror about the hinge axes.

In some applications, it is desirable to reduce the torsional stiffness (which is typically expressed in terms of the torsional spring constant $K_\phi$) of the hinge, in order to increase the range of motion and/or to reduce the resonant frequency and the force required to drive the motion. The stiffness can be reduced by reducing the transverse dimensions (thickness) and/or increasing the length of the hinge. These same dimensional changes, however, will also reduce the resistance of the hinge to deflection (expressed in terms of the transverse spring constants $K_X$ and $K_Y$, which scale as the inverse cube of the length and the cube of the thickness). As a result, the hinge will be more prone to breakage due to shock or vibration, for example.

Embodiments of the present invention that are described hereinbelow provide hybrid hinges and other elastic structures that have enhanced compliance (i.e., reduced stiffness) in a desired mode of motion, while maintaining strong resistance against other, undesired modes of motion. In the disclosed embodiments, these principles are applied in producing hinges characterized by both reduced torsional stiffness and robustness against transverse deflection. Such hinges thus have an increased angular range of motion and require less force for rotation than hinges of comparable transverse stiffness that are known in the art. Alternatively, the principles of the present invention may similarly be applied in producing springs with reduced resistance to stretching or desired modes of bending.

In the embodiments described below, a hybrid hinge comprises a long, narrow beam, which is made from a relatively rigid material of high elasticity and is contained within a rigid frame, which may be of the same or similar material as the beam. The end of the hinge is anchored to the frame, but one or more longitudinal gaps between the hinge and the frame enable the hinge to rotate about a longitudinal axis relative to the frame. These gaps are filled with a solid filler material, which permits the hinge to rotate freely, typically causing the torsional spring constant $K_\phi$ to increase by no more than about 10-20% relative to the "bare" hinge, while at the same time increasing resistance to transverse deformation (as expressed by spring constants $K_X$ and $K_Y$) substantially—possibly tenfold or more.

The use of the filler material around the hinge provides added design flexibility, in that it permits the spring constant to be chosen independently of the transverse stiffness. In resonating systems, such as resonant scanning mirrors, the spring parameters may thus be chosen to give the desired resonant frequency and Q factor, without sacrificing mechanical robustness.

In some embodiments, the gaps between the hinge and the frame are filled with a soft solid material, having a Poisson ratio at least 50% higher than that of the hinge and frame, and possibly more than 100% higher. At the same time, Young's modulus for this soft material is at least 50% less than that of the hinge and frame, and may desirably be less than 10% of Young's modulus for the hinge and frame. For example, in a typical embodiment, the hinge and frame are etched from crystalline semiconductor material, such as silicon (Young's modulus 150 GPa and Poisson ratio 0.17), while the soft fill material comprises a polymer, such as polydimethylsiloxane (PDMS), SU-8 photoresist, RTV silicone, or other elastomer or epoxy (Young's modulus<5 GPa, Poisson ratio>0.45 and possibly≥0.49). Alternatively, the hinge and frame may be made from any other suitable elastic material, including metals such as steel or titanium, while the gaps may be filled with any suitable soft or porous material satisfying the above criteria.

In alternative embodiments, other types of filler materials may be used with similar effects. Such materials are not necessarily "soft" in the sense defined above. For example, highly-elastic carbon nano-tubes may be placed across the gaps to give the desired effects of rotational compliance and transverse stiffness.

MEMS Hinges

FIG. 1 is a schematic illustration of a MEMS scanning mirror assembly 20, in accordance with an embodiment of the present invention. Although this figure shows, for the sake of simplicity, a mirror with a single scanning axis, the principles of this embodiment may similarly be applied to multi-axis gimbaled mirrors, such as those described in the above-mentioned U.S. Patent Application Publication 2013/0207970. The scanning axis is identified in the figure, for convenience, as the Z-axis, and the angle of rotation about the Z-axis is identified as $\phi$.

Assembly 20 comprises a base 22 formed from a silicon wafer, which is etched to define a micromirror 24. (The reflective coating of the micromirror is omitted for simplicity.) The micromirror is connected to the base by a pair of hinges 26, comprising long, thin beams etched from the silicon substrate. These beams are connected at their inner ends to the micromirror and at their outer ends to the base. Wings 28 of micromirror 24 adjoin hinge 26 on both sides, thus defining a frame, with gaps between the frame and the hinge.

As explained earlier, in some applications it is desirable to reduce the transverse (X and Y) thickness of hinges 26 in order to allow the hinges to rotate about their longitudinal (Z) axes with large angular range and low torsional resistance, as expressed by the spring constant $K_\phi$. For example, hinges may be made 1-300 μm thick and 1-10000 μm long. The thinner the hinges, however, the lower will be their resistance (as expressed by $K_X$ and $K_Y$) to transverse deformation. Thus, even weak forces in the X- or Y-direction may cause hinge 26 to bend and, ultimately, to break.

Figure 2:
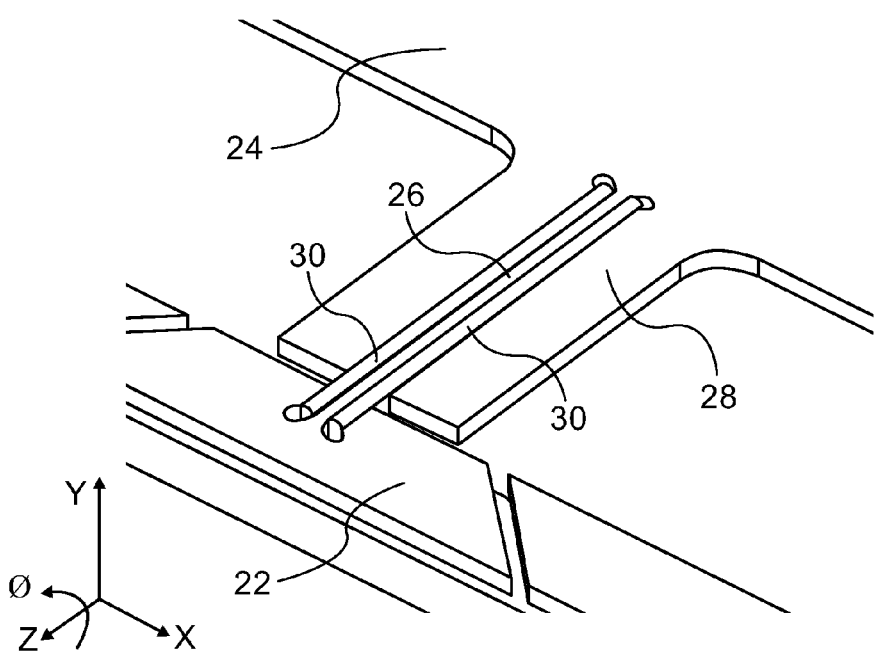
FIG. 2 is a schematic detail view of an elastic hinge, in accordance with an embodiment of the present invention.

FIG. 2 is a schematic detail view of hinge 26, in accordance with an embodiment of the present invention. As illustrated in this figure, in order to alleviate the problem of the low resistance of the hinge to transverse deformation, the gaps between each hinge 26 and the adjoining wings 28 are filled with a suitable soft filler material 30. (Alternatively, as noted earlier and as illustrated in FIG. 10, other sorts of filler materials, not necessarily "soft," may be configured for this purpose.) The filler material in this embodiment may comprise, for example, a suitable adhesive or other polymer, or a porous (foam) material, with high Poisson ratio and low Young's modulus, as explained above. Filler material 30 may be applied at wafer level during the fabrication process (as illustrated in FIG. 6), or it may be dispensed into the gaps in liquid form after fabrication. In the latter case, if the filler material comprises an adhesive, such as SU-8 epoxy, it can also be used to attach magnetic rotors to wings 28, similar to the rotors described in the above-mentioned U.S. Patent Application Publication 2013/0207970.

Filler material 30 need not completely fill the gaps between hinge 26 and wings 28. For example, it may be sufficient to fill only the part of the gap near the end of wing 28 in order hold the hinge in place against bending.

Filler material 30 acts as a sort of bearing within the gaps, in that it prevents, or at least drastically reduces, deformation of hinges 26 in the X- and Y-directions, while only minimally increasing torsional ($\phi$) stiffness. Consequently, external forces in the transverse (X and Y) directions are largely absorbed by filler material 30 and give rise to only minimal bending stresses in hinge 26. The hinge can thus be designed only for torsional stress, with a large range of rotation about the longitudinal (Z) axis. Filler material 30 damps shock and vibrations, thus enhancing the robustness and durability of assembly 20.

Figure 3A:
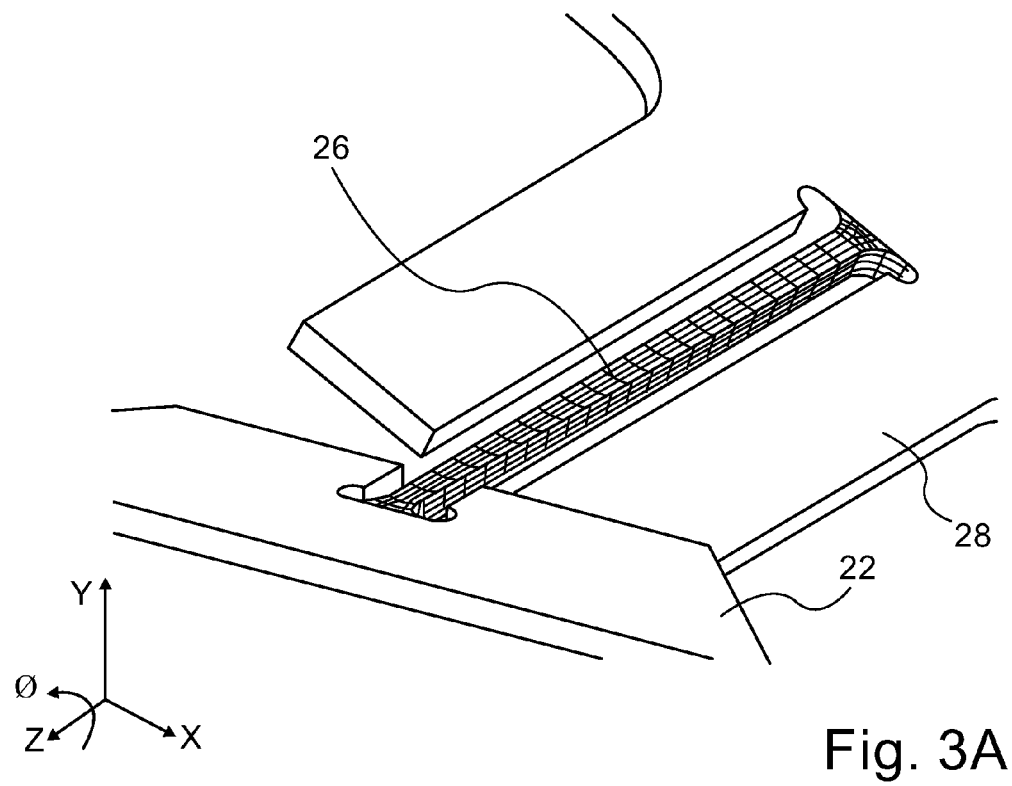
FIG. 3A is a schematic, pictorial illustration of an elastic hinge under torsional deflection, in accordance with an embodiment of the present invention.
Figure 3B:
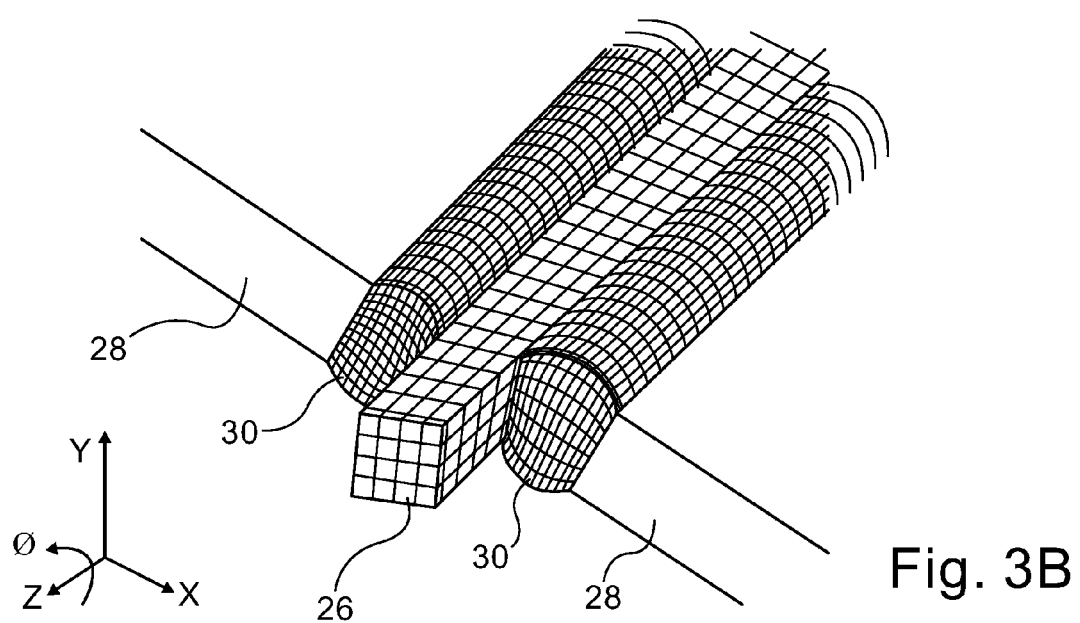
FIG. 3B is a schematic detail view of the elastic hinge of FIG. 3A, showing deformation of a filler material in the hinge due to torsional deflection of the hinge, in accordance with an embodiment of the present invention.

FIGS. 3A and 3B illustrate the effect of torsional deflection (rotation about the Z-axis) on hinge 26 and on filler material 30, respectively. FIG. 3A shows the rotational motion of wings 28 relative to frame 22 as it affects hinge 26, while FIG. 3B shows the resulting deformation of filler material 30. Rotation of hinge 26 stretches material 30, particularly near its interfaces with the hinge, but material 30 offers only minimal resistance to this sort of stretching, which does not compress or otherwise change the volume of the material.

Figure 4:
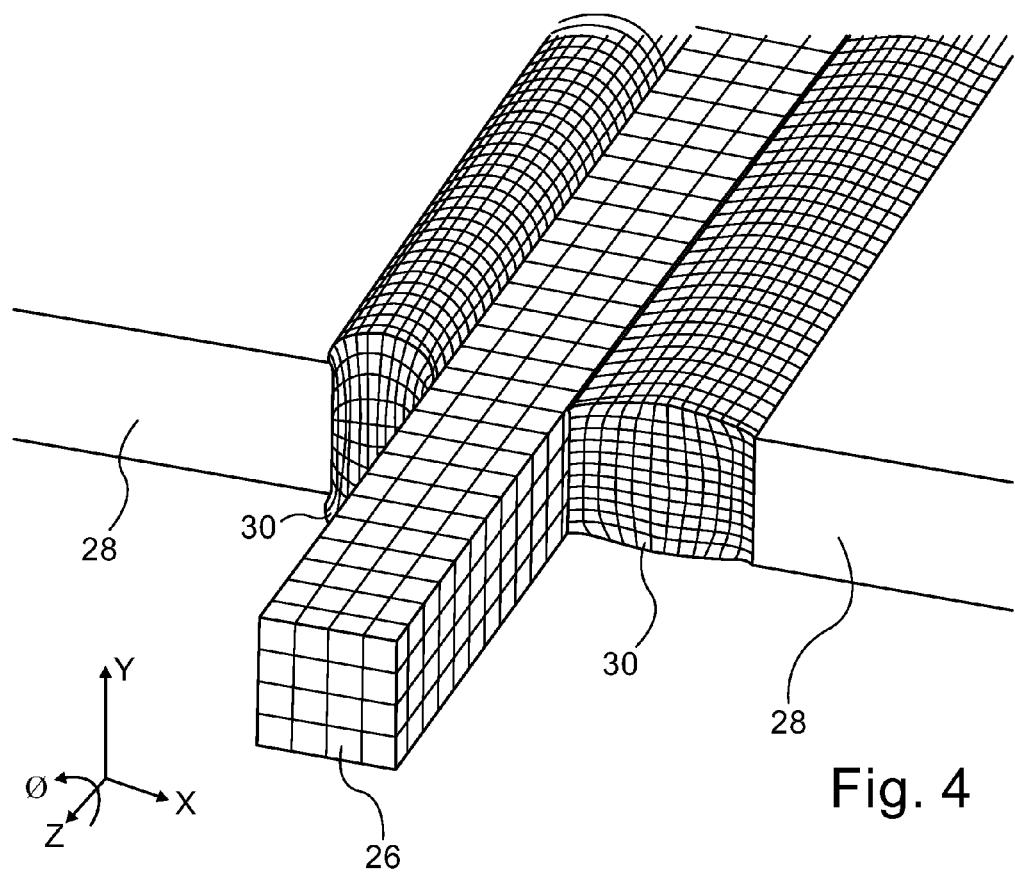
FIG. 4 is a schematic detail view of an elastic hinge, showing deformation of a filler material in the hinge due to in-plane defection, in accordance with an embodiment of the present invention.

FIG. 4 illustrates the response of filler material 30 to deflection of hinge 26 in the plane of mirror 24 (i.e., deflection in the X-Z plane). The high Poisson ratio of material 30 causes deformation in response to the transverse (X-direction) force and resistance to bending of the hinge. Under typical operating conditions, with a hinge thickness of 1-300 μm and a filler material with a Poisson ratio of 4.9, the filler material increases the stiffness (resistance to transverse force) of the hinge in the X-direction by more than 1500%, relative to the stiffness of the hinge alone.

Figure 5:
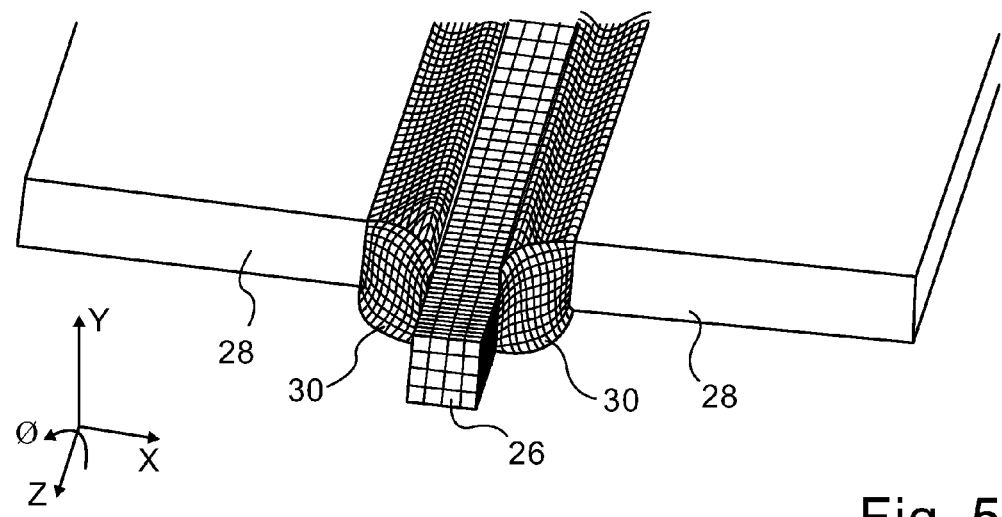
FIG. 5 is a schematic detail view of an elastic hinge, showing deformation of a filler material in the hinge due to out-of-plane defection, in accordance with an embodiment of the present invention.

FIG. 5 illustrates the response of filler material 30 to deflection of hinge 26 out of the plane of mirror (deflection in the Y-Z plane), due to a Y-direction force. The Y-direction movement causes a bulk deformation of the filler material, which consequently resists bending of the hinge. Under the conditions mentioned in the preceding paragraph, the stiffness of the hinge in the Y-direction is increased by about 1000%.

Fabrication Process

FIGS. 6A-6F are schematic sectional views through a wafer during a process of fabrication of a silicon hinge reinforced by a polymeric filler material, in accordance with an embodiment of the present invention. In this example, the hinge is fabricated in a silicon on insulator (SOI) wafer, in which a crystalline silicon layer 32 overlying an insulating substrate 34 (FIG. 6A), although other types of substrates may alternatively be used, as is known in the MEMS art.

To begin the process (FIG. 6B), gaps 36 surrounding the hinge are opened in silicon layer 32, by deep reactive ion etching (DRIE) or another suitable process. Layer 32 is then overlaid with a polymer or porous filler (FIG. 6C), which fills gaps 36. The filler may comprise, for example, PDMS, which is applied by spin coating. Filler 38 is then etched down (FIG. 6D), thus removing the excess filler material and exposing layer 32, while leaving filler material 40 in gaps 36.

Figure 6A:
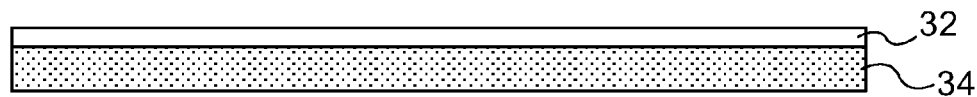
FIGS. 6A-6F are schematic sectional views through a semiconductor wafer at successive stages of a process of fabrication of an elastic hinge reinforced by a filler material, in accordance with an embodiment of the present invention.
Figure 6B:
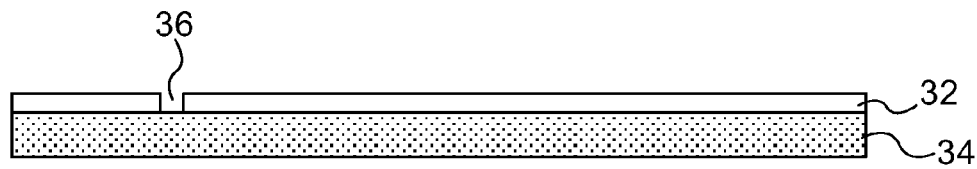
Figure 6C:
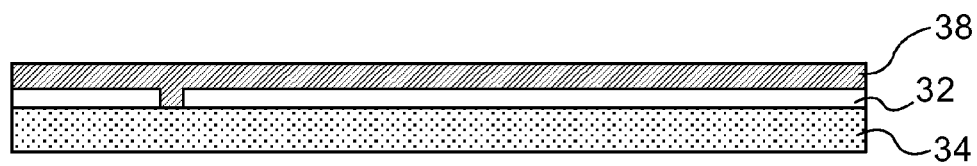
Figure 6D:
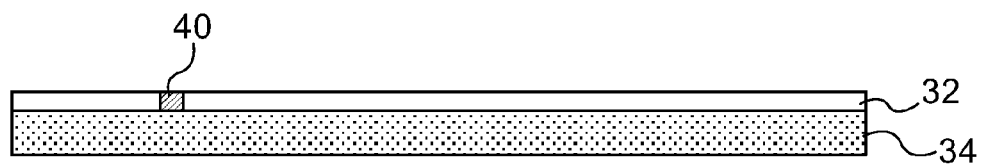
Figure 6E:
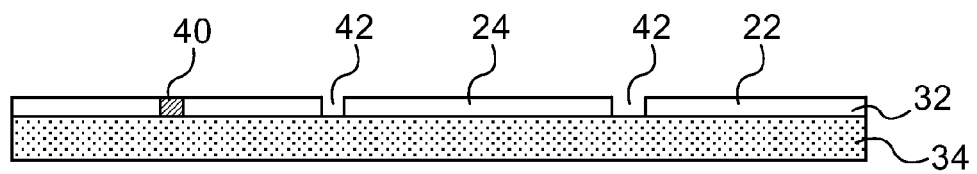
Figure 6F:
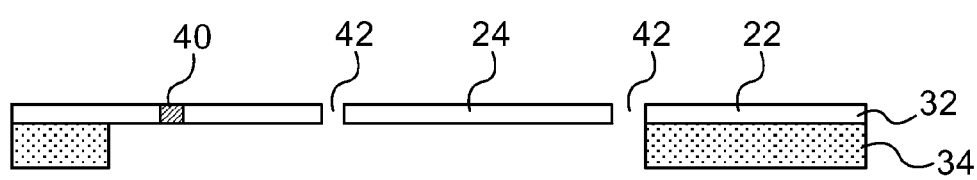

To form the MEMS structures, a photolithographic etching process is applied to layer 32 (FIG. 6E), creating spaces 42 between mirror 24, base 22 and other moving elements, including the mirror hinges. To allow the mirror to move freely over a large range, substrate 34 may optionally be thinned away from the back side of the mirror and hinges (FIG. 6F). The wafer is then diced, and assembly of the scanner is completed as described, for example, in the documents cited in the Background section above.

Alternative Embodiments

Although the embodiments described above relate particularly to scanning mirrors, the principles of the present invention may similarly be applied in other types of devices, particularly (although not exclusively) MEMS devices. Some examples are shown in the figures that follow.

Figure 7:
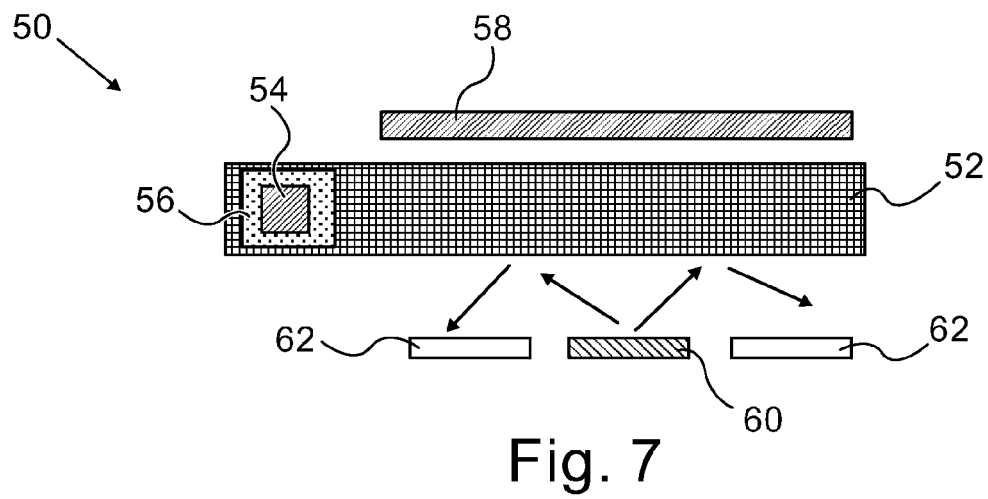
FIG. 7 is a schematic side view of an inertial sensor, in accordance with an embodiment of the present invention.

FIG. 7 is a schematic side view of an inertial sensor 50, in accordance with an embodiment of the present invention. Sensor 50 may serve, inter alia, as an accelerometer or crash sensor. The frame in this case is a proof mass 52, which is mounted on a torsion spring 54, causing the mass to rotate by a calibrated amount in response to acceleration. Rotation of mass 52 can be detected, for instance, by a capacitive sensor 58 or by optical sensing, using a LED emitter 60 and one or more photodiodes 62. (Both types of sensors are shown in the figure for the sake of completeness.) Alternatively, other sorts of sensors may be used for this purpose, such as or electromagnetic or piezoelectric sensors.

To enable inertial sensor 50 to operate with high sensitivity about the rotational axis of torsion spring 54, without breakdown due to shocks in other directions, the torsion spring is made long and thin for torsional flexibility, and the gap between the torsion spring and proof mass 52 is filled with a soft filler material 56. As in the embodiments described above, any suitable material with high Poisson ratio and low Young's modulus may be used, such as adhesives and other polymers, as well as foams and other porous materials.

Figure 8:
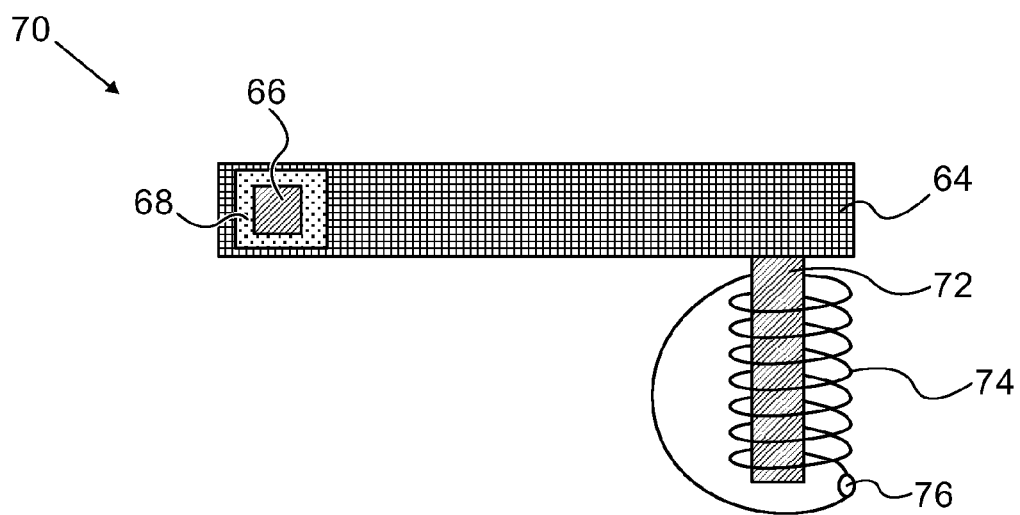
FIG. 8 is a schematic side view of an energy harvesting device, in accordance with another embodiment of the present invention.

FIG. 8 is a schematic side view of an energy-harvesting device 70, in accordance with another embodiment of the present invention. In this embodiment, the frame is a motion arm 64, which is mounted to rotate about a torsion spring 66. Motion of arm 64 actuates an energy-harvesting assembly, by translating a permanent magnet 72 along the axis of a coil 74. The translation generates current in the coil, which can be used to charge a battery 76 or drive a low-power electrical device. Motion arm 64 rotates in response to external inertial forces, such as motion of an arm or leg of a user on which energy harvesting device 70 is mounted. In order to maximize the range of motion of motion arm 64 relative to the applied inertial force, torsion spring 66 is made long and thin. The gap between the torsion spring and the motion arm is filled with a suitable soft material 68, as in the preceding embodiments, in order to enhance the robustness of the device against shocks and other transverse forces.

Figure 9A:
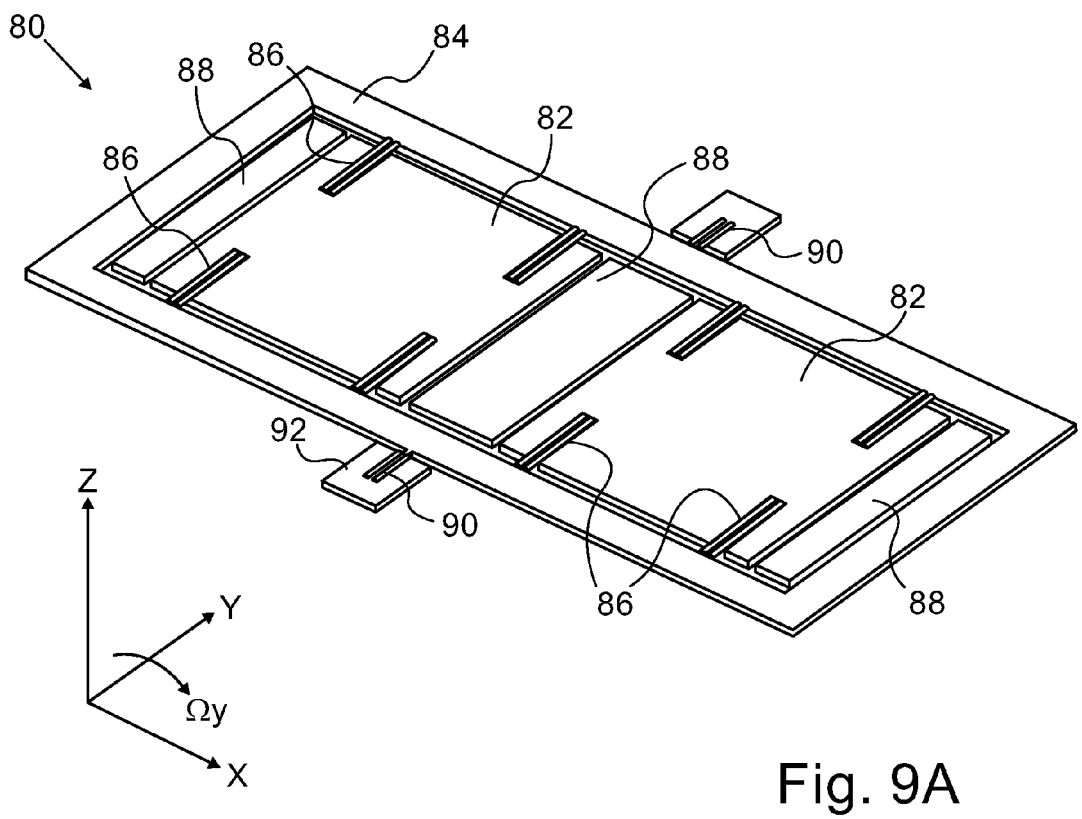
FIG. 9A is a schematic, pictorial illustration of a gyroscopic sensor, in accordance with yet another embodiment of the present invention.

FIG. 9A is a schematic illustration of a gyroscopic sensor 80, in accordance with yet another embodiment of the present invention. Two masses 82 are suspended on a base 84 by suspension beams 86, and are harmonically actuated in the in-plane direction (in the X-Y plane) by a suitable drive, such as a parallel plate, comb drive, piezoelectric drive or electromagnetic drive. In the pictured embodiment, electrodes 88 are driven with currents at the appropriate frequency to actuate masses 82. When sensor 80 is rotated about the Y-axis, base 84 will harmonically tilt about torsion hinges 90, with a tilt amplitude ($\Omega y$) proportional to the rate of rotation. The tilt may be measured using capacitive, optic, electromagnetic, or any other suitable means of detection, as described above with reference to FIG. 7.

Figure 9B:
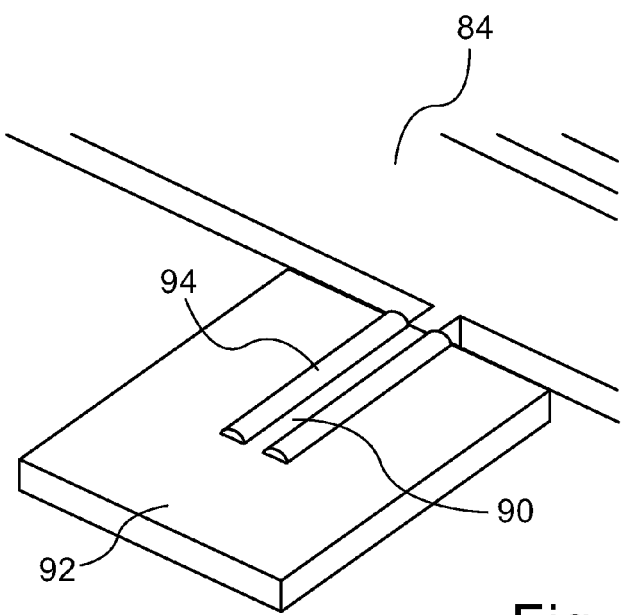
FIG. 9B is a schematic detail view of an elastic hinge in the sensor of FIG. 9A, in accordance with an embodiment of the present invention.

FIG. 9B is a schematic detail view of hinge 90 and a surrounding frame 92 in sensor 80, in accordance with an embodiment of the present invention. The gaps between hinges 90 and frame 92 are filled with a suitable filler material 94 to damp transverse forces, as explained above.

Figure 10:
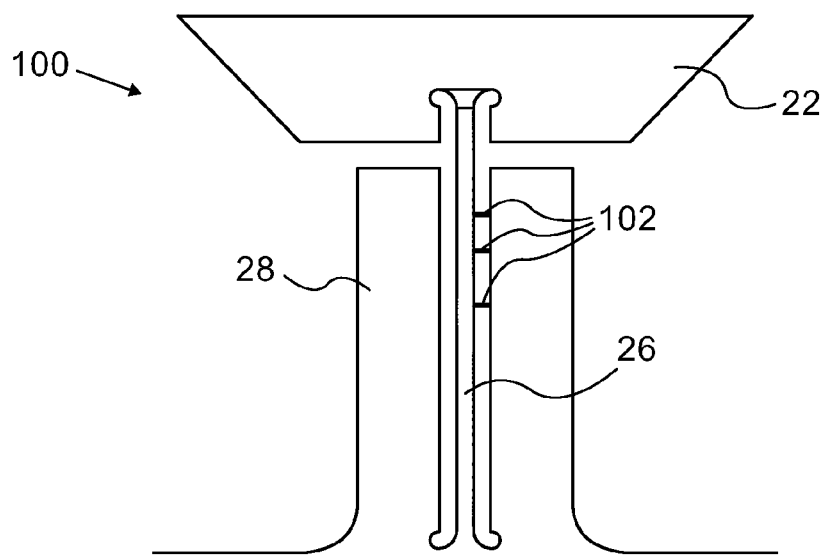
FIG. 10 is a schematic detail view of an elastic hinge assembly, in accordance with an alternative embodiment of the present invention.

FIG. 10 is a schematic detail view of an elastic hinge assembly 100, in accordance with an alternative embodiment of the present invention. In this embodiment, an array of carbon nano-tubes 102 are formed across the gaps between hinge 26 and frame 28. Nano-tubes 102 are not "soft" in the sense defined above, since such nano-tubes typically have a higher Young's modulus than do the silicon hinge and frame. Nano-tubes 102 in hinge assembly 100, however, are configured in such a way as to give the desired effects of rotational compliance and transverse stiffness. Nano-tubes are inherently very stable and thus may have some advantages over polymeric materials for the present purposes.

Figure 11A:
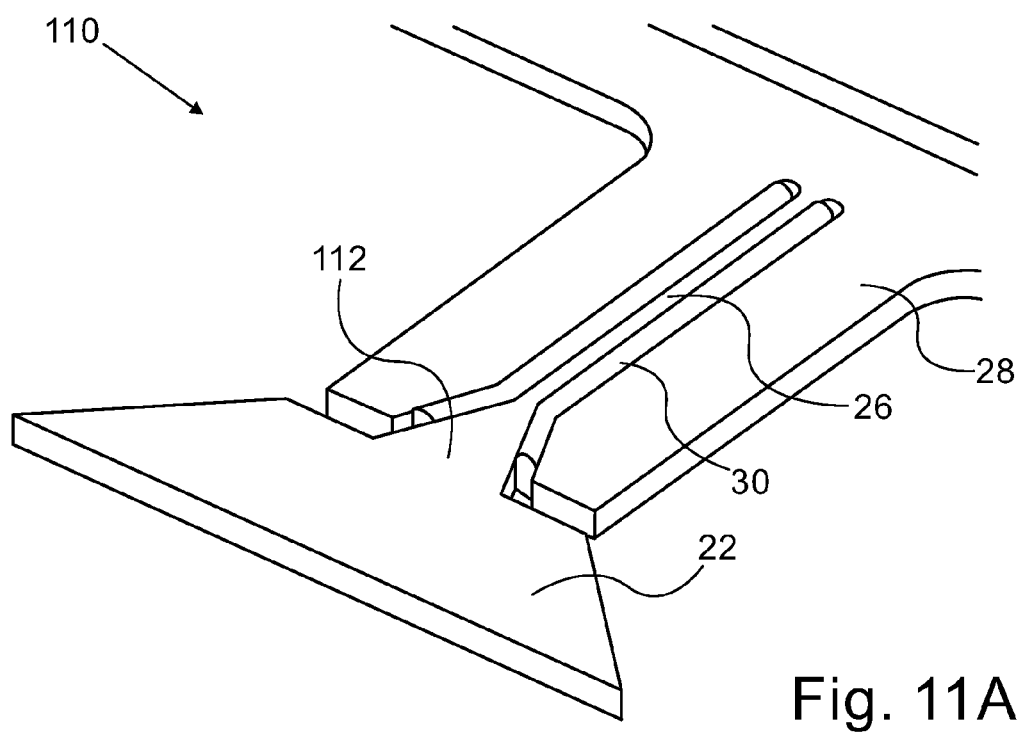
FIG. 11A is a schematic, pictorial view of an elastic hinge assembly, in accordance with a further embodiment of the present invention.
Figure 11B:
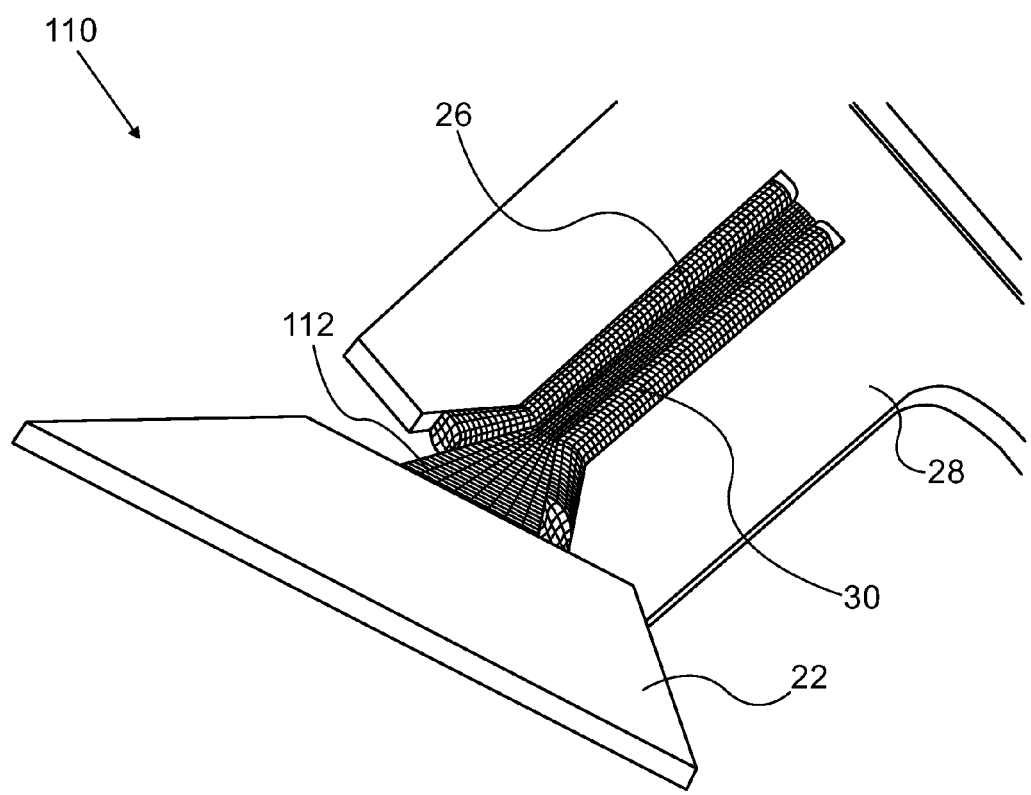
FIG. 11B is a schematic, pictorial illustration of the assembly of FIG. 11A under deflection, in accordance with an embodiment of the present invention.

FIGS. 11A and 11B schematically illustrate a hinge assembly 110 of alternative design, in which elastic hinge 26 comprises a broad anchor 112 connecting the hinge to base 22, in accordance with an embodiment of the present invention. The broadening in-plane transverse dimension of anchor 112, together with filler material 30 in the gaps, is useful particularly in decreasing the shear stress that may arise in hinge 26 due to in-plane or out-of-plane shocks. This feature of anchor 112 is illustrated particularly in FIG. 11B, which shows the effect of both torsional deformation and deflection in hinge assembly 110.

Figure 12:
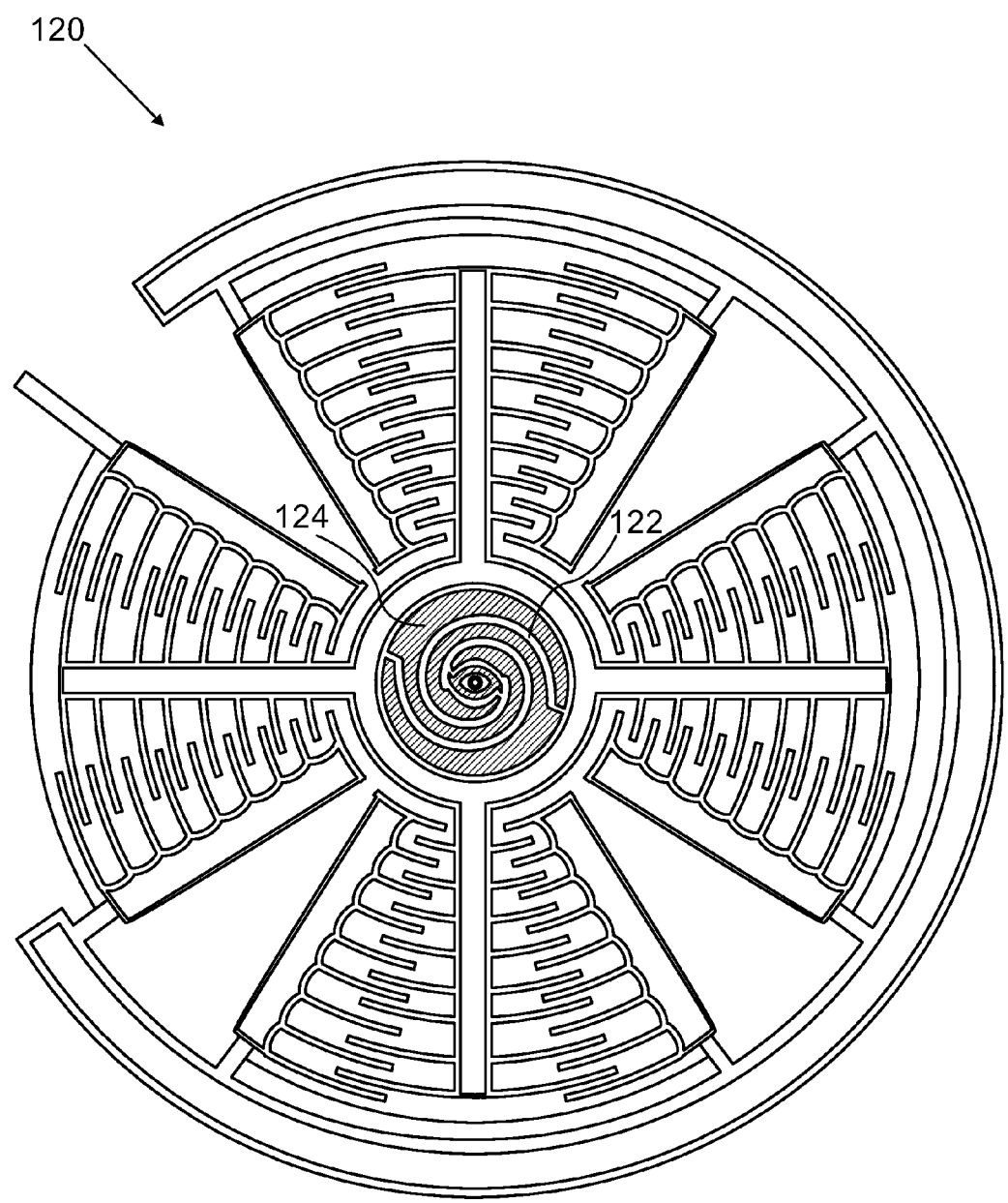
FIG. 12 is a schematic top view of a resonant radial spring, in accordance with an embodiment of the present invention.

FIG. 12 is a schematic top view of a resonant radial spring assembly 120, in accordance with an embodiment of the present invention. Assembly 120, which is produced by a MEMS process, is based on an element having the form of a spiral bending spring 122 and has weak stiffness in the in-plane direction. A polymer 124 is applied to the gaps in the spring, in the manner described above, to prevent the in-plane movement without substantially increasing the rotational stiffness. In other words, polymer 124 allows spring 122 to bend, but increases the stiffness of assembly 120 against sideways compression. This embodiment illustrates that the principles of the present invention are applicable to various types of springs, and not only the sort of hinges that are shown in the preceding figures.

Although the implementation examples described above relate to MEMS devices, the principles of the present invention may similarly be applied in hinges produced by other technologies and on other scales, not only in microscale systems, but also in meso- and macro-scale devices. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A mechanical device, comprising:
  a long, narrow beam made of a rigid, elastic material, wherein the beam comprises a torsion spring;
  a rigid frame surrounding at least a part of the beam and configured to rotate about the torsion spring, with a gap running longitudinally along the beam between the beam and the frame; and
  a solid filler material, softer than the rigid, elastic material, which fills at least a part of the gap between the beam and the frame so as to permit rotational movement of the frame about a longitudinal axis of the beam while inhibiting at least one other mode of movement of the beam within the frame.

2. The device according to claim 1, wherein the at least one other mode of movement that is inhibited by the filler material causes a transverse deformation of the beam.

3. The device according to claim 1, wherein the beam further comprises an anchor, which connects the torsion spring to the frame.

4. The device according to claim 3, and comprising a mirror, wherein a first end of the beam is attached to the frame, while a second end of the beam is attached to the mirror, so that the mirror rotates on the torsion spring relative to the frame.

5. The device according to claim 1, and comprising a sensor, which is configured to sense a relative rotation between the frame and the beam.

6. The device according to claim 5, wherein the sensor is configured to sense an acceleration of the device.

7. The device according to claim 5, wherein the sensor is configured to operate as a gyroscopic sensor.

8. The device according to claim 1, and comprising an energy-harvesting assembly, coupled to harvest energy generated by a relative rotation between the frame and the beam.

9. The device according to claim 1, wherein the frame and the beam comprise parts of a semiconductor wafer, in which the gap is etched between the frame and the beam.

10. The device according to claim 1, wherein the filler material has a Poisson ratio at least 50% higher than that of the beam, and a Young's modulus at least 50% less than that of the beam.

11. The device according to claim 9, wherein the filler material is selected from a group of materials consisting of polymers and adhesives.

12. The device according to claim 1, wherein the filler material comprises an array of nano-tubes.

13. A method for producing a mechanical device, the method comprising:

forming, from a rigid, elastic material, a long, narrow beam, the beam comprising a torsion spring and at least partially surrounded by a rigid frame with a gap running longitudinally along the beam between the beam and the frame; and filling at least a part the gap with a solid filler material, softer than the rigid, elastic material, so as to permit rotational movement of the frame about a longitudinal axis of the beam while inhibiting at least one other mode of movement of the beam within the frame.

14. The method according to claim 13, wherein the at least one other mode of movement that is inhibited by the filler material causes a transverse deformation of the beam.

15. The method according to claim 13, wherein forming the long narrow beam comprises anchoring the torsion spring to the frame.

16. The method according to claim 15, wherein anchoring the torsion spring comprises attaching a first end of the beam to the frame, and wherein the method comprises attaching a mirror to a second end of the beam, so that the mirror rotates on the torsion spring relative to the frame.

17. The method according to claim 13, wherein the filler material has a Poisson ratio at least 50% higher than that of the beam, and a Young's modulus at least 50% less than that of the beam.

18. The method according to claim 17, wherein the filler material is selected from a group of materials consisting of polymers and adhesives.

19. The method according to claim 13, wherein the rigid, elastic material comprises a semiconductor wafer, and wherein forming the beam comprises etching the semiconductor wafer to define both the frame and the beam, with the gap therebetween.

20. The method according to claim 19, wherein filling at least a part of the gap comprises, after etching the gap, coating the wafer with the filler material, so that filler material fills the gap, and then removing an excess of the filler material outside the gap.

* * * * *